United States Patent [19]

Ainslie et al.

[11] Patent Number: 4,634,638
[45] Date of Patent: * Jan. 6, 1987

[54] HIGH MELTING POINT COPPER-GOLD-TIN BRAZING ALLOY FOR CHIP CARRIERS

[75] Inventors: Norman G. Ainslie, Croton-on-Hudson; Joseph M. Harvilchuck, Lagrangeville; Mario J. Interrante, New Paltz; William J. King, Jr., Poughkeepsie; Paul H. Palmateer, Wappingers Falls, all of N.Y.; John F. Sullivan, Raleigh, N.C.

[73] Assignee: International Business Machines Corporation, Armonk, N.Y.

[*] Notice: The portion of the term of this patent subsequent to Aug. 13, 2001 has been disclaimed.

[21] Appl. No.: 331,717

[22] Filed: Dec. 17, 1981

[51] Int. Cl.⁴ .............................................. H05K 7/06
[52] U.S. Cl. .................................... 428/671; 428/672
[58] Field of Search ........... 228/122, 123, 124, 180 A, 228/186, 198, 231, 263.18; 428/671, 672

[56] References Cited

U.S. PATENT DOCUMENTS

| | | | |
|---|---|---|---|
| 3,496,630 | 2/1970 | Duff et al. | 228/231 X |
| 3,844,026 | 10/1974 | Hutchins | 228/122 |
| 4,278,990 | 7/1981 | Fichot | 228/122 |
| 4,360,142 | 11/1982 | Carpenter | 228/123 |
| 4,418,857 | 12/1983 | Ainslee | 228/180 A |
| 4,465,223 | 8/1984 | Cammarano et al. | 228/263.18 X |

FOREIGN PATENT DOCUMENTS

| | | | |
|---|---|---|---|
| 48-14505 | 5/1973 | Japan | 228/122 |
| 54-22163 | 2/1979 | Japan | 428/672 |
| 16731 | 2/1980 | Japan | |

Primary Examiner—Kenneth J. Ramsey
Attorney, Agent, or Firm—Graham S. Jones, II

[57] ABSTRACT

Brazing of elements to electronic chip carrying substrates requires brazing materials strong at high temperatures used to remove and replace chips. Flanges and pins are brazed with Au:Sn brazing alloys modified during brazing by addition of copper to the brazing material to promote formation of the higher melting point $\beta$ phase of the alloy and a Group VIII metal to draw Sn out of the melt by gettering, also to promote formation of the $\beta$ phase of the alloy and to thicken the braze material. A copper preform is plated with Ni and juxtaposed with surfaces to be brazed and the brazing material to add Ni and copper to the melt.

8 Claims, 14 Drawing Figures

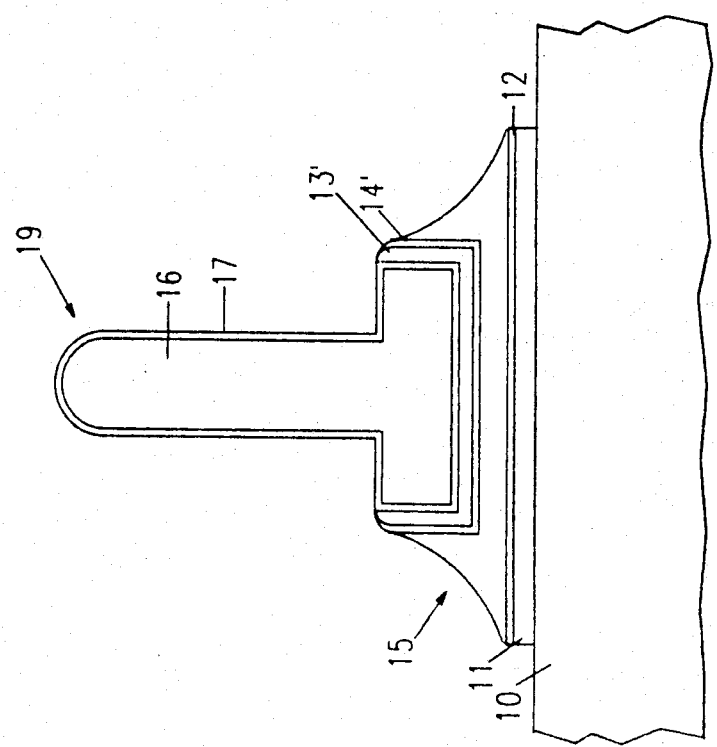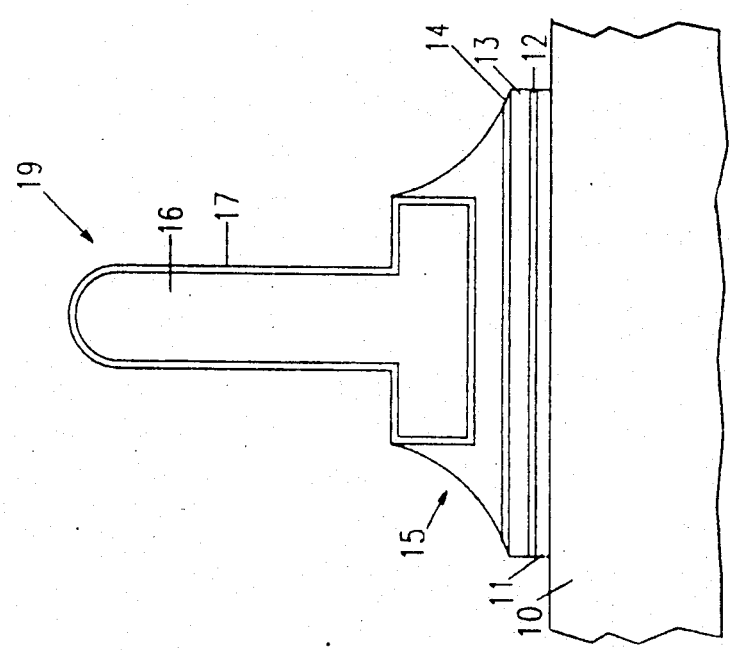

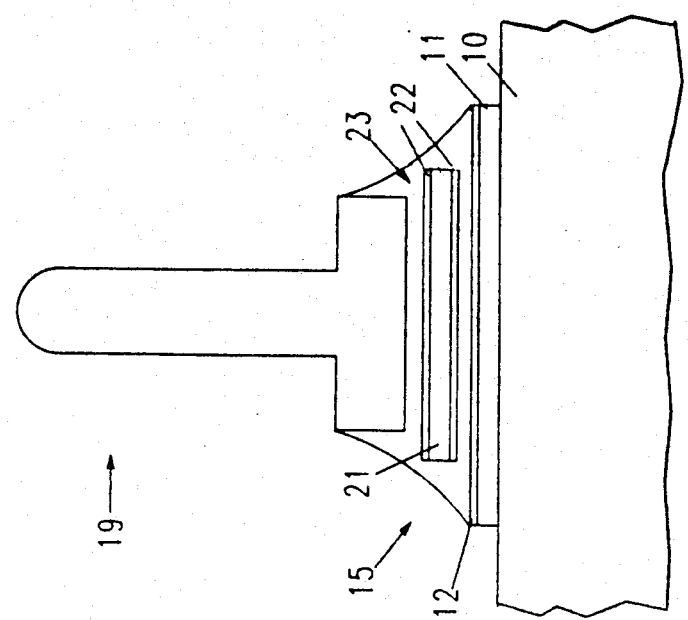
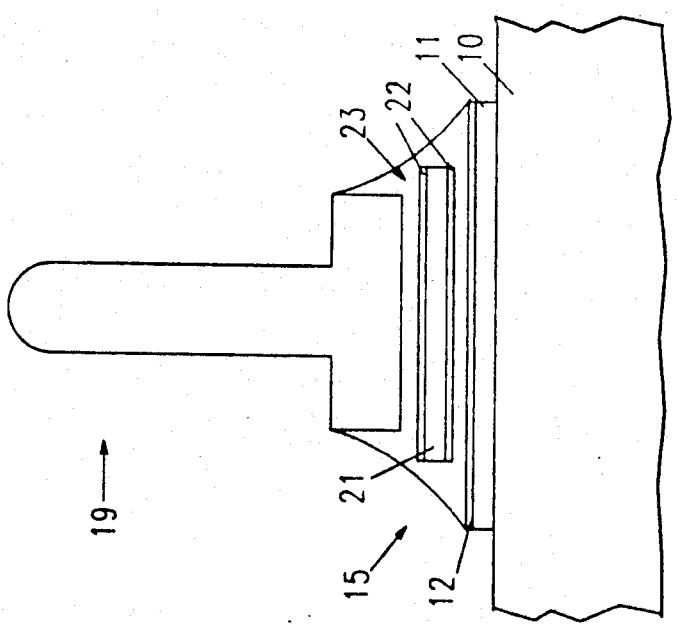

HIGH MELTING POINT COPPER-GOLD-TIN BRAZING ALLOY FOR CHIP CARRIERS

BACKGROUND OF THE INVENTION

Field of the Invention

This invention relates to bonding of input/output electrical connection pins and other components of a chip carrying substrate in an electronic system. More particularly, this invention relates to bonding alloys useful in electronic circuit interconnections of a chip carrying substrate and its pins in a manner compatible with the continuous reheating of the chips.

OBJECT OF THE INVENTION

An object of this invention is an alloy which enables economical attachment or replacement of a chip on the substrate without disturbing the bond between pins connected to the substrate or the surfaces to which the substrate itself is bonded. In other words, an object of the invention is an alloy which bonds pins, etc., to the substrate and the substrate to its carrier with the alloy having a melting point such that the structure is unaffected by heating to the temperature required for melting of the solder connections retaining the chips upon the substrate. Furthermore an object of this invention is to provide a braze which is more economical than utilization of additional gold to provide such results.

DISCUSSION OF INVENTION

Brazing of elements to electronic chip carrying substrates such as multilayered ceramic substrates requires a brazing or soldering material which remains strong at high temperatures used for rework, i.e., removal and replacement of chips on the substrate, with the heat being required for heating the lead-tin solder balls supporting the chips. A standard solution to this problem is to use gold-tin solder whose melting point subsequent to brazing is higher than the initial 280° C. melting point.

Because circuit connection pins have tended to tilt out of alignment during rework heating, and because problems have arisen in flange sealing with numerous cycles of rework, in accordance with this invention the braze alloy is modified during brazing by adding copper to the brazing material (which raises the melting temperature subsequent to bonding by increasing the amount of the higher melting point β phase of the alloy in the braze material) and a metal such as nickel, palladium or another Group VIII metal (which will tend to draw tin out of the melt or to getter the tin thereby promoting the apparent ratio of gold and copper to tin and the formation of the β phase of the Au-Sn alloy thereby tending to raise the melting temperature of the brazed joint subsequent to cooling, even further as well as thickening the braze material).

BACKGROUND ART

U.S. Pat. No. 3,648,357 of Green, "Method for Sealing Microelectronic Device Packages" is concerned with hermetically sealing of a Kovar and glass housing and a Kovar alloy (Ni, Fe, Co) cover together with an eutectic gold-tin solder. In the past, Green stated that (Col. 1, line 12 et seq.) such packages had been sealed by placing "... a solder preform between the periphery of the edges of the housing and the cover to be sealed together". Then the parts to be soldered together were "placed in a sealing machine and ... heated to a sufficient temperature to cause the solder to fuse onto the cover and housing. Unfortunately, imperfect hermetic seals result in a substantial portion of the packages so sealed. Not only may leaks in the seal result due to voids therein, but the temperatures necessary to melt the solder and form the seal may be sufficient to damage the microelectronic device contained in the package ... ". In Green, the approach was to coat an 80:20 Au:Sn preform upon both the housing flange and upon the mating surface of the cover which fits upon the housing. In that way, the preform solder halves can be joined together at a low temperature at which the solder melts requiring little heat so as to reduce damage to the microelectronic device. However, since the Kovar alloy reacts badly with Au:Sn solder, the surfaces of Kovar alloy are first coated with gold by plating. Then the preforms are soldered to the plated housing and cover. The pretinning had the disadvantage that it raised the temperature of melting of the solder to the degree that the gold is melted from the Kovar plated surfaces. The purpose of the Green patent was to keep the melting point down to about 330° C. rather than the 400° C. temperature which would result with melting of the gold into the solder under equilibrium conditions. Use of the lower temperature assures that at equilibrium only a portion of the plated gold "will be dissolved into the solder". We have discovered that substitution of copper for gold in a bonding alloy has similar advantages with considerable cost advantages because of the lower cost of copper as a material.

A current practice in the industry is to join pins composed of Kovar alloy with a thin film of palladium with nickel pads deposited upon a thin film of molybdenum. The solder used is an Au:Sn brazing alloy. The Pd layer melts away after about four of the ten solder reflows one would expect under current practices in microelectronic circuit manufacture. A problem of leaching of Ni from the Kovar alloy pins and the pad below into the braze results. The leaching results in poor adhesion, causing rejection of the entire device. Accordingly, it is the desideratum to be able to reheat the braze repeatedly during such reflows with freedom from the remelting of the braze and consequent introduction of impurities into the braze which would ruin the product because of such weakening of the interface with the Kovar alloy.

Ainslie et al, "Au/Sn/Ag Braze Alloy", IBM Technical Disclosure Bulletin, Vol. 21, No. 8, p. 3118 (January 1979), describes a braze alloy (67 Au/15 Sn/18 Ag) for electronic packaging for Be-Cu contact pins or Kovar (Ni, Co, Fe) pins. In either case, there is either a member of the Group IB of the Periodic Table of the Elements (Cu) or a Group VIII metal (Ni, Fe, Co) in the Be-Cu or Kovar pins which fails to have the effect provided in accordance with the present invention. In addition, the alloy of the ratio of 67 Au to 15 Sn is not the low melting 80/20 eutectic ratio which permits low temperature brazing of the alloy, followed by formation of a higher melting temperature braze joint. Thus, the temperature effect is the opposite of what is desired here. The 18% of Ag in the alloy, however, acts as a substitute for gold since it is a Group IB metal which raises the melting point of the resulting alloy. Further, Ag as an alloying constituent, is expensive relative to Cu.

In accordance with this invention, objects are bonded together with a braze of near eutectic Au:Sn and Cu solder at a low temperature, and in the process the melting point is raised substantially above the eutectic point. This avoids pin tilt of the brazed pins, braze strength degradation and other relative motion between the parts being brazed together during reflow operations upon the microelectronic circuit.

The metallic brazing alloy of this invention involves a braze joining a first surface to a second surface by means of a gold-tin copper brazing solder, with a melting temperature of the brazing solder substantially increased during brazing to a temperature substantially above the initial melting temperature of the solder which is reflowed repeatedly whereby the solder joint formed by the braze is unaffected by reflow cycles. This is accomplished by increasing the amount of copper and $\beta$ phase in the braze, which greatly increases the melting point as the percentage of the Au-Sn alloy in the braze is decreased.

Preferably the alloy of this invention involves a first surface brazed to a second surface by means of a gold-tin brazing solder, characterized by forming the braze with a source of copper and a source of a Group VIII metal in combination with the brazing solder, to come into contact with the first and second surfaces during brazing, whereby the melting temperature of the brazing solder is raised substantially during brazing to a temperature substantially above the initial melting temperature of the solder which is reflowed repeatedly whereby the solder joint formed by the braze is unaffected by reflow cycles. This is accomplished by increasing the amount of $\beta$ phase in the braze, which greatly increases the melting point as the percentage of Au-Sn alloy in the braze is decreased.

BRIEF DESCRIPTION OF THE DRAWINGS

FIG. 1 shows a fragment of a multilayered ceramic substrate carrying a connector pin.

FIGS. 2-8 are modifications of FIG. 2 with different locations of Group IB and Group VIII metals or different pin materials.

DESCRIPTION OF THE PREFERRED EMBODIMENT

Figure 4:
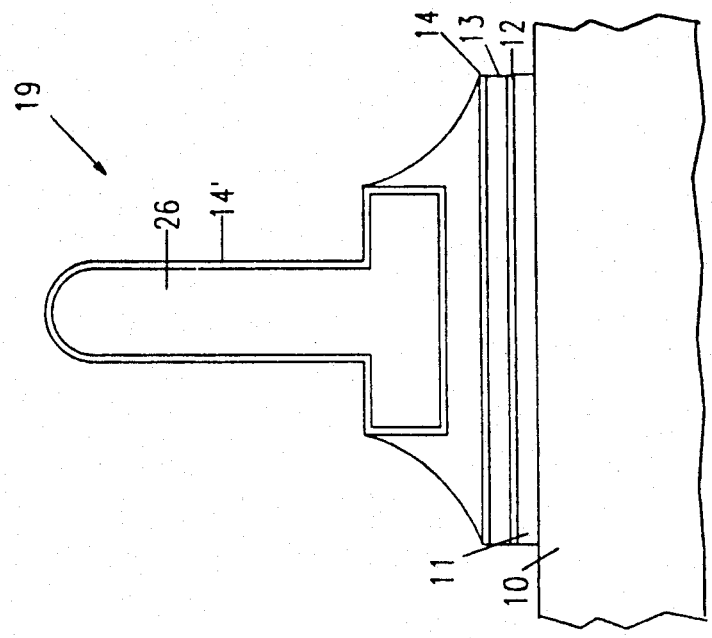

The problems solved by this invention relate to the brazing of pins to a chip carrying substrate or the brazing of the substrate to a flange used to support the substrate carrying chips and to provide for clamping in a hermetically sealed chip packaging arrangement.

A braze in accordance with this invention is suitable for electronic packaging of components together such that the braze joints thus produced exhibit melting temperatures that are substantially higher than those of the original braze alloy used in the operation. This feature is especially important when the brazing operation produces a braze joint having a melting temperature that is normally lower than the temperature at which subsequent manufacturing operations must occur. An example is the brazing of nickel plated multilayered ceramic structures at 400° C. using Au-20 wt. % Sn braze alloy (melting point 280° C. prior to one or more 350° C. chip joining operations. The problem is that the braze joint experiences partial melting at 350° C. with its many attendant undesirable effects, included among which are:

1. Relative motion between the members that were joined.
2. Diffusion of Sn from the braze joint to the nickel plated surfaces to form Ni-Sn intermetallics, thus depleting the surfaces of unreacted nickel which is essential for good adhesion.
3. Collapse and distortion of the Au-Sn fillet due to out-diffusion of tin and due to run-out of the liquid phase of the braze fillet at 360° C., with its attendant loss of strength and side support in the case of I-O pins.

The present invention includes applying thick copper, or copper-rich layers (0.0001-0.002 inch thick) onto one or both of the surfaces to be brazed together by any appropriate means, say electroplating electroless plating, vacuum deposition or silk screening.

The basis of the invention can be understood in relation to the Au-Sn phase diagram, and in relation to copending U.S. application Ser. No. 221,606 filed Dec. 31, 1980 of Ainslie et al in which the surfaces being brazed together are plated with thick gold layers.

When Au-20 wt % Sn braze alloy cools to room temperature it is comprised of two phases, the brittle Au-Sn compound and the ductile, gold-rich $\beta$ phase. The alloy has a melting point of 280° C. Increasing the gold content of the alloy decreases the amount of Au-Sn present at room temperature, and also increases the liquidus temperature. Thus upon reheating, say to 350° C., the alloy melts only partially. If enough gold is added to the basic alloy, say enough to bring it to the Au-10Sn composition, there will be no partial melting at all at 350° C., and there would be no brittle Au-Sn phase in the structure at room temperature. Therefore, by providing thick gold layers on one or both of the surfaces being brazed together, it is possible to accomplish these desirable results, and to reduce or eliminate the undesirable effects enumerated previously, by means of a solid-liquid reaction that occurs at the brazing temperature between the liquid braze alloy and the gold surfaces. A braze joint having a melting point much higher than the original braze alloy is the result.

In accordance with the present invention the thick gold layers are replaced by copper, copper-rich layers, or by solid copper or copper-rich parts. The copper partially substitutes for gold in the desirable $\beta$ phase discussed above, thus providing a cheap and relatively simple alternative in accomplishing the results cited above. In accordance with the invention, the process is as follows: (1) braze at the standard braze temperature (say 400° C.) to form the joint and to establish the limits of the fillet, (2) hold at this temperature sufficiently long to allow some uptake of copper to occur with its concomitant partial solidification, (3) raise the temperature (say to 425°-475° C.) to allow the copper uptake reaction to occur more completely without fear of flowout ("pin climb"), and (4) cool to room temperature.

FIG. 1 shows a multilayered ceramic substrate 10 carrying a molybdenum pad 11, which is conventionally protected with a layer of nickel 12 about 3-4 micrometers thick. Next is a layer 13 of a relatively thick film of copper about 0.0002–0.0025 cm thick. The layer 13 is coated with a very thin layer 14 up to 1.25 μm thick of a Group VIII metal such as Fe, Co, Ni, Ru, Rh, Pd, Os, Ir or Pt to serve as a source of an Sn gettering metal. In this example the gettering metal layer 14 is nickel. Next, a braze fillet 15 of Au 80:Sn 20 brazing composition is set on top of the layers mentioned above. Here the fillet is a narrow strip of metal. Above the fillet 15 is a conventional pin 19 (or a Cu base pin) of Kovar alloy 16 coated with a thin film 17 of nickel. When the Au-Sn fillet 15 is heated to above 280° C. which is its liquidus point for the eutectic 80:20 alloy, it melts and when the temperature rises to about 390° to 405° C. (nominally 395° C.) the copper layer 13 is at least partially melted into the Au:Sn braze melt along with some of the Group VIII metal 14, e.g., nickel. The gold and the copper in the alloy tend to form a higher temperature liquidus alloy with a higher melting point subsequent to cooling of the melt. The nickel in the melt tends to getter or collect the tin drawing it out of reaction with the Au-Sn alloys in the melt, thereby reducing the amount of tin available for combination in the Au-Sn alloy. The effect is to provide an effectively greater percentage of gold plus copper in Au-Sn alloy thereby tending to promote formation of the gold and copper-rich β phase. The resulting braze joint is very strong and its melting point is far higher so subsequent reflows of Pb:95-Sn:5 solder balls in the temperature range from 350° C. to 360° C. tend not to cause melting of the braze joint as occurred heretofore.

In FIG. 2, the layer 13' of copper and the layer 14' of the gettering metal such as nickel from Group VIII has been coated onto the pin 19 to be joined by the preform to the substrate 10. Preferably the thicknesses of layers 13' and 14' are about the same as layers 13 and 14. Otherwise, the embodiment is the same as FIG. 1. The point is that the copper and nickel, for example, can be located on the top of the Mo, Ni pad or can be placed upon the surface of the pin 19. In either case as the braze material melts, the copper and nickel are introduced into the braze melt.

Figure 3:
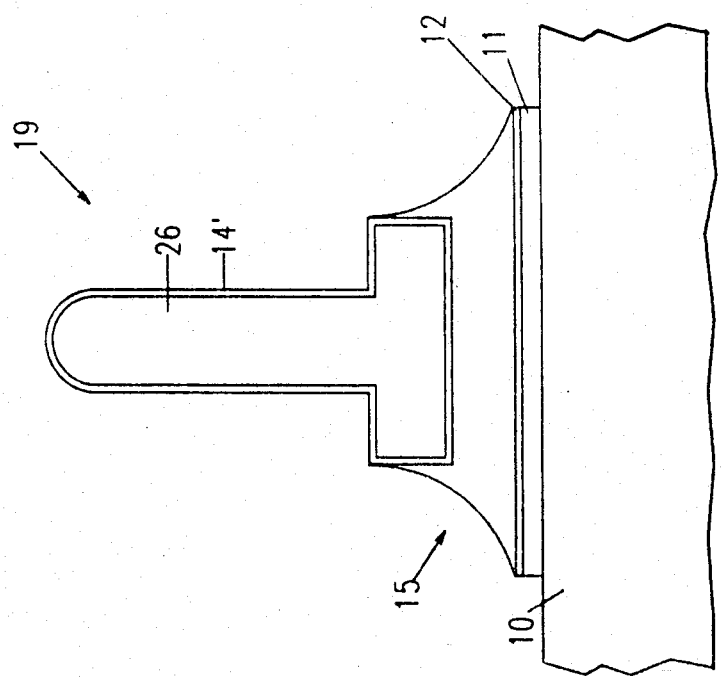

In FIG. 3, the pin 19 has been replaced by a Cu pin 26 coated with a thin layer of nickel 14' about 1.25 μm thick, or less, or other Group VIII metal. The Cu pin serves as a source of copper metal in order to add to the Au in the Au-Sn melt. Thus, as in FIG. 2, the source of the two additives to the braze during its melting phase is the metal on the stud of the pin 26.

In FIG. 4, the pin is the same as in FIG. 3 but at the base of the fillet, the nickel and copper layers 14 and 13 from FIG. 1 have been added so that the additional copper and Group VIII metals are available to the fillet from above and below during its molten phase.

Figure 5:
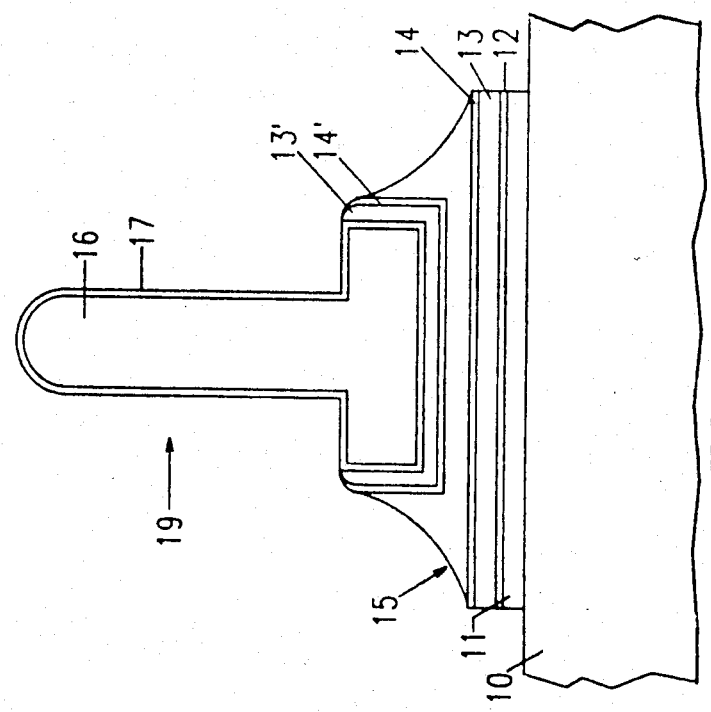

In FIG. 5, the Kovar (or Cu base) pin 19 of base 16 with coating 17 of FIGS. 1 and 2 is used with the layers of copper and nickel 13' and 14', and the layers of copper 13 and nickel 14 are added at the base of the fillet on pad 11 coated with layer 12 as in FIG. 1. Again, an ample supply of copper 13, 13' and the gettering Group VIII metals Ni, Pd, etc., 14, 14' are available to the molten braze alloy 15.

Figure 6:
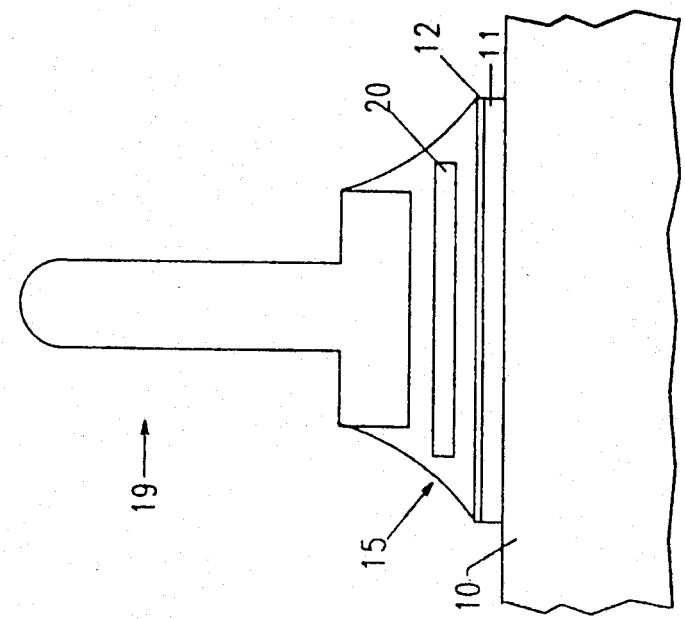

In FIG. 6, the pin 19 which may be of the type in FIG. 1 or FIG. 3 sits upon a typical Au:Sn braze fillet 15 which has been modified to include within it a copper and gettering metal (Group VIII) preform 20 which comprises, for example, a copper-rich Cu-Ni alloy such as 1-15% Ni. The extra layers of nickel and copper or the equivalent both upon the pin 19 and upon the layer 12 on pad 11 can be omitted, although they need not be eliminated.

In FIG. 7, the embodiment is essentially the same as that in FIG. 6 except that the preform 20 has been replaced by a preform 23, of copper metal 21 coated with gettering metal 22. The gettering metal in this case is very thin, as is the layer 14 in FIG. 1.

In FIG. 8, the embodiment is basically the same as in FIG. 7 with the exception that a Cu layer 21 in preform 23 is plated with Ni or the equivalent gettering metal 22.

The reasons for the resistance to melting are as follows:

1. The initial reflow of the solder balls of chips carried on the substrate (after the brazing) causes the solid state reaction of the added Cu with the Au-Sn alloy to form the β phase Au:Cu:Sn alloy with the latter having a higher melting temperature. Continued reflows cause further reaction within the alloy to form the β phase and thereby strengthen the joint instead of degrading the joint as would happen with simple Au-Sn braze fillets 15.

2. It has been noted that in the flange brazing, much less brittle Ni-Sn intermetallic compound is formed at the interfacial surfaces. In addition, this process prevents the climbing of the braze metal up the shank of a pin 16. Stiffening of the braze is provided by adding the Group VIII metal such as Pd or Ni in small quantities which forms a dispersed precipitate of the metal with Sn which stiffens the alloy especially at reflow temperatures. It also raises the melting temperature by increasing the amount of β phase Au-Sn alloy to a significant degree.

Figure 9:
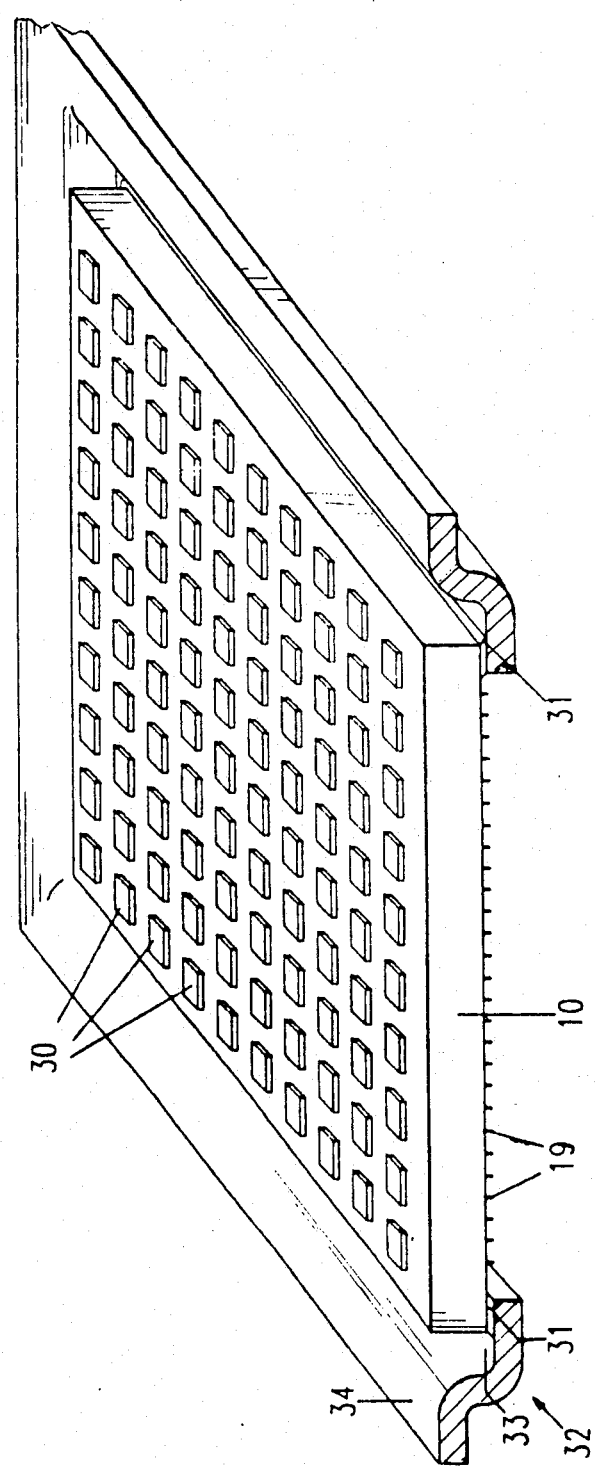
FIG. 9 shows a perspective, partially sectional view of the upper surface of a substrate of FIGS. 1-8 carrying a large number of semiconductor chips. The substrate is mounted upon a flange. On the lower surface of the substrate are the pins shown in FIGS. 1-8.

FIG. 9 shows a square substrate 10 carrying 100 chips 30 with the substrate 10 brazed to a square mounting flange 32 with a lower flange surface 33 carrying the substrate by braze metal 31 on the periphery of the substrate 10. Beneath the substrate 10 are the pins 19. Flange 32 includes an upper surface 34 extending about the top of flange 32. Surface 34 also forms the periphery of flange 32, whereas surface 33 forms the inner frame of flange 32.

Figure 10:
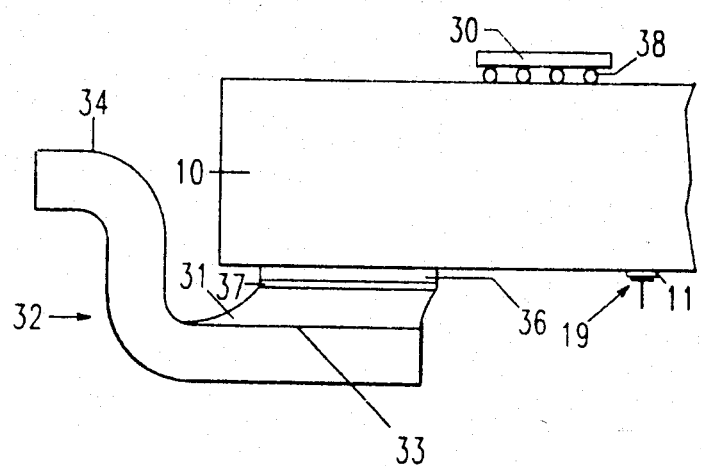
FIG. 10 is an enlarged, front elevational view of the section shown in FIG. 9. The braze joints of the flange and the pins to the substrate are shown.

FIG. 10 shows the substrate 10 with Mo border 36 coated with nickel layer 37. Layer 37 is brazed to the lower flange surface 33 by the braze metal 31. A set of electrical connection pins 19 is brazed to the base of the substrate 10.

Figure 11:
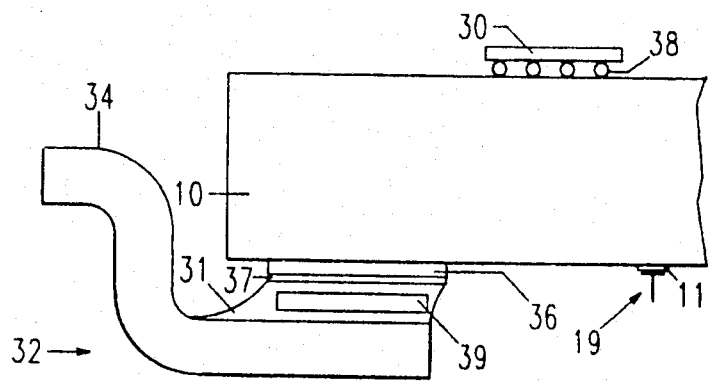
FIG. 11 shows a modification of FIG. 10.

FIG. 11 shows a preform 39 within the braze fillet 31. Preform 39 is composed of a copper-nickel alloy or the equivalent. The braze 31 comprises the usual Au-20 Sn brazing material.

Figure 12:
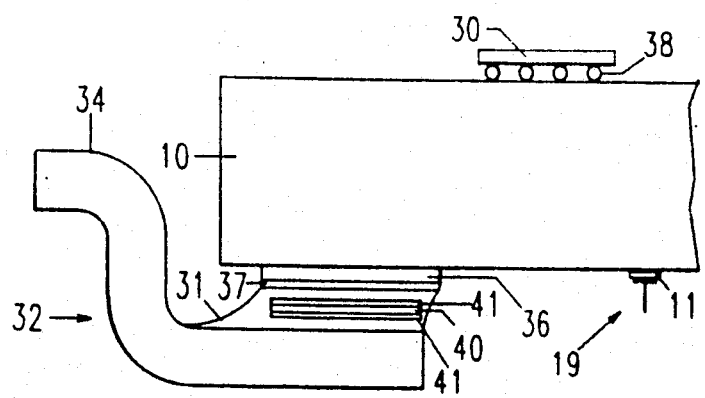
FIG. 12 shows another modification of FIG. 10.

FIG. 12 shows a modification of the preform of FIG. 11 with the preform composed of a copper slab 40 plated with a pair of layers of a thin film 41 of nickel or the equivalent (Group VIII metal) of up to about 0.0006 mm.

An alternative way of producing the alloy of this invention is to incorporate a smidgeon of copper in the original Au-20 Sn alloy as well. For example, up to 1 to 2% of Cu by weight would be suitable as a substitute for gold.

Figure 13:
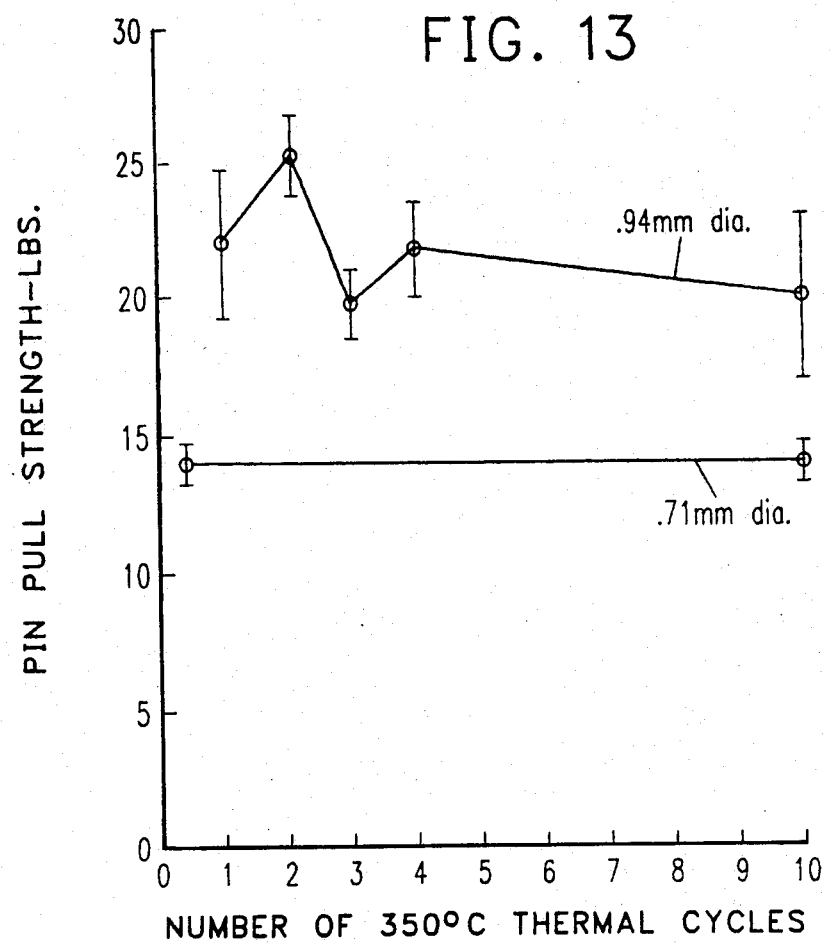
FIG. 13 is a graph of pin pull strength as a function of the number of 350° C. thermal cycles to which the band is heated subsequent to brazing.

FIG. 13 shows the results of pin pull strength testing as a function of the number of 350° C. thermal cycles. The upper curve is for pins of about 0.94 mm diameter composed of BeCu and the lower curve is for pins of about 0.71 mm diameter of BeCu with a brazing material of Au-20 Wt % Sn.

Figure 14:
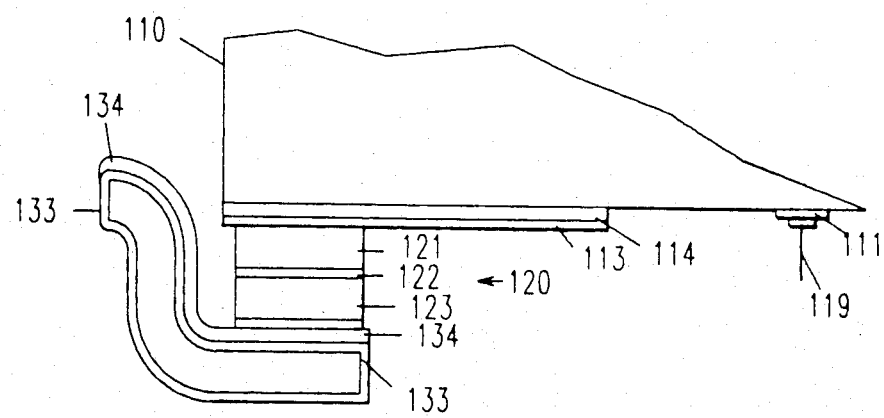
FIG. 14 is a modification of the braze joints of FIGS. 10-12.

FIG. 14 shows a modification of the arrangements of FIGS. 10–12, wherein the substrate 110 carrying chips has a pad 113 on the lower surface composed of a thin film of nickel coated with a thin film 114 such as copper (or a substitute film of gold or palladium). A preform 120 consists of three layers with the thicker layers 121 and 123 on the top and bottom composed of near eutectic Au-Sn. In the center of the preform 120 is a thin film 122 of a metal such as copper, Au-Cu, Au, Ag, Pd, etc., which provides a source of metal which will increase the melting point of the braze as above. The mounting flange 133 is composed of Kovar alloy coated with a layer 134 of metal including at least a Group IB metal preferably copper and alternatively Au, Ag or Pd or a combination of the above possibly plus a Group VIII metal such as Ni and the like as described above. Examples of layer 134 composition include Cu, AuCu, Au, CuNi, AuCuNi, etc.

The preform 120 is about 11–12 mils (0.28–30 mm) thick. The substrate is about 2.5 to 5 mm thick, and the flange 132 is about 0.6 mm thick. When the braze is heated, the result is very similar to the results achieved above in that the additional Group IB and Group VIII metals in the alloy increase the melting temperature above the 80/20 Au-Sn eutectic temperature as above to produce a joint composed of an alloy of the kind employed in this invention. Preferably copper is employed as the Group IB metal in order to reduce the cost of the entire structure.

Having thus described our invention, what we claim as new and desire to secure by Letters Patent is:

1. In a metallic joint, the improvement comprising a brazing alloy consisting essentially of gold and tin in eutectic proportions and having copper interdiffused therein.

2. A substrate including a pad composed of a thin film of nickel is coated with a thin film of a metal selected from the group including copper, gold, and palladium,
   said pad being juxtaposed with a preform comprising three layers,
   said three layers including a lower layer deposited on said substrate,
   a middle layer deposited on said lower layer, and
   an upper layer deposited upon said middle layer,
   with said upper and lower layers comprising Au:Sn,
   said middle layer comprising a thin film of a metal selected from the group consisting of copper, gold, silver and palladium,
   said upper and lower layers being thicker than said middle layer, and
   a mounting flange juxtaposed with said preform having an upper surface composed of a composition selected from the group consisting of Cu, AuCu, Au, CuNi, and AuCuNi with copper included in at least one of said pad, said preform and said flange.

3. A pair of metal elements including a first element and a second element,
   said elements being joined by a braze joint,
   said first element having a first surface,
   said second element having a second surface,
   a brazing solder consisting essentially of gold-tin and copper,
   said first surface being joined to said second surface by means of said brazing solder,
   with a melting temperature of the brazing solder substantially increased during brazing to a temperature substantially above the initial melting temperature of the solder,
   thereby the solder joint formed by the braze is unaffected by reflow cycles as the result of increasing the amount of copper and phase in the braze,
   which greatly increases the melting point as the percentage of the Au-Sn alloy in the braze is decreased.

4. A joint secured to a microelectronic circuit formed of a braze of eutectic Au:Sn solder combined with metal consisting essentially of Cu during brazing at a low temperature to elevate the melting point substantially above the eutectic point subsequently to avoid pin tilt of brazed pins, braze strength degradation and other relative motion between the parts being brazed together during reflow operations upon the microelectronic circuit.

5. A braze joint in accordance with claim 4 formed by (1) brazing at the standard braze temperature on the order of 400° C. to form the joint and to establish the limits of the fillet, (2) holding at said temperature sufficiently long to allow some uptake of copper to occur with its concomitant of partial solidification, (3) then raising the temperature to about 425°–475° C. to allow the copper uptake reaction to occur more completely without fear of flowout, and (4) then cooling to room temperature.

6. A structure comprising two metallic members and a braze joint formed between said two metallic members formed by the process comprising,
   coating one of said metallic member with a film consisting essentially of copper,
   said film of copper being coated with a source consisting essentially of Au 80:Sn 20 brazing composition, and
   brazing said members together with said coatings of copper and Au:Sn brazing composition on said one metallic member.

7. A structure in accordance with claim 6 with both of said members having included a film consisting essentially of copper thereon prior to brazing.

8. A pair of metallic elements joined by means of a braze joint,
   said joint consisting essentially of gold, tin, and copper,
   said first element having a first surface,
   said second element having a second surface,
   said joint having been formed by the process of brazing with a body consisting essentially of eutectic gold-tin solder and a source consisting essentially of copper in intimate contact with said solder,
   said braze joint including said first surface and said second surface.
   said first surface having been brazed to said second surface,
   said body of eutectic gold-tin solder having been positioned between said first and second surfaces during brazing, and
   said source consisting essentially of copper having been in intimate contact with said eutectic mixture during brazing.

* * * * *